(12) United States Patent
Ku et al.

(10) Patent No.: US 11,855,608 B2
(45) Date of Patent: Dec. 26, 2023

(54) SYSTEMS AND METHODS FOR PACKAGING AN ACOUSTIC DEVICE IN AN INTEGRATED CIRCUIT (IC)

(71) Applicant: RF360 Singapore Pte. Ltd., Singapore (SG)

(72) Inventors: Huan En Ku, Singapore (SG); Joo Shan Yam, Singapore (SG); Chee Kong Lee, Singapore (SG)

(73) Assignee: RF360 SINGAPORE PTE. LTD., Singapore (SG)

( * ) Notice: Subject to any disclaimer, the term of this patent is extended or adjusted under 35 U.S.C. 154(b) by 663 days.

(21) Appl. No.: 17/007,454

(22) Filed: Aug. 31, 2020

(65) Prior Publication Data
US 2021/0313957 A1 Oct. 7, 2021

Related U.S. Application Data

(60) Provisional application No. 63/005,760, filed on Apr. 6, 2020.

(51) Int. Cl.
| H03H 9/17 | (2006.01) |
| H03H 3/08 | (2006.01) |
| H03H 9/10 | (2006.01) |

(52) U.S. Cl.
CPC .............. *H03H 9/176* (2013.01); *H03H 3/08* (2013.01); *H03H 9/1014* (2013.01)

(58) Field of Classification Search
CPC ........ H03H 9/176; H03H 3/08; H03H 9/1064; H03H 3/02; H03H 9/0523; H03H 9/059; H03H 9/1014; H03H 9/1071
See application file for complete search history.

(56) References Cited

U.S. PATENT DOCUMENTS

| 5,969,461 | A | 10/1999 | Anderson et al. |
| 6,498,422 | B1 | 12/2002 | Hori |
| 7,239,068 | B2 | 7/2007 | Miyaji |
| 7,673,386 | B2 | 3/2010 | Stelzl et al. |
| 9,704,770 | B2 | 7/2017 | Suemori |
| 2004/0251777 | A1 | 12/2004 | Yamamoto et al. |
| 2005/0116352 | A1 | 6/2005 | Warashina et al. |
| 2019/0348964 | A1 | 11/2019 | Ha et al. |

OTHER PUBLICATIONS

International Search Report and Written Opinion for International Patent Application No. PCT/IB2021/052862, dated Jul. 13, 2021, 17 pages.

*Primary Examiner* — Jung Kim

(74) *Attorney, Agent, or Firm* — Withrow & Terranova, PLLC

(57) ABSTRACT

Systems and methods for packaging an acoustic device in an integrated circuit (IC) include walls formed on a wiring substrate. The walls have a height which is just shorter than an expected height of a solder bump on the acoustic device after solder reflow. The walls are positioned on either side of the acoustic device and a small portion lies underneath an exterior edge of the acoustic device such that a relatively small gap is formed between an upper surface of the wall and the lower surface of the acoustic device. By providing a small gap between wall and acoustic device, encroachment by an encapsulating material into a keep out zone of the acoustic device is minimized.

36 Claims, 8 Drawing Sheets

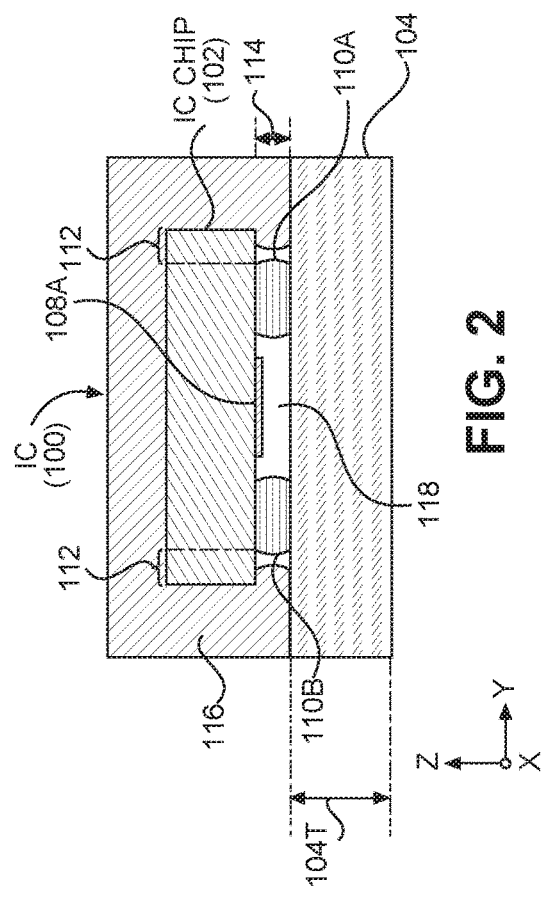
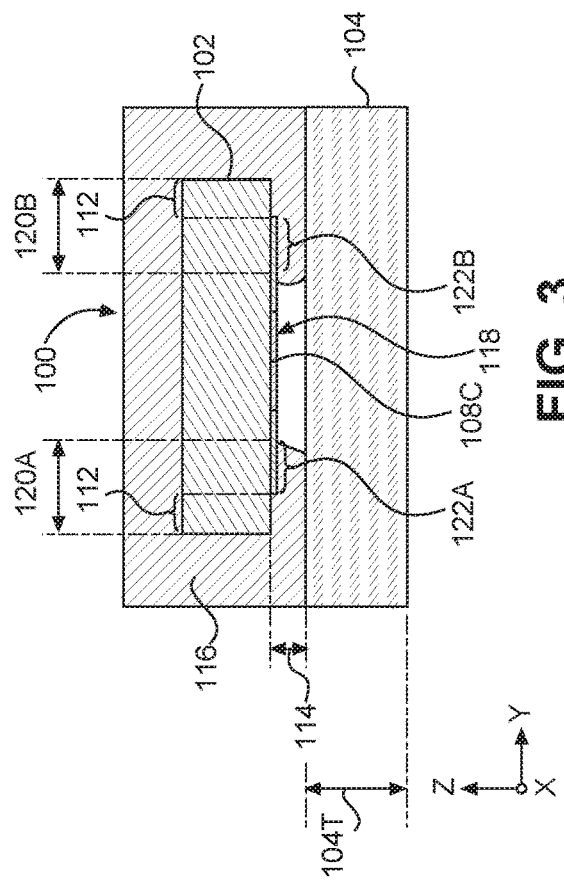
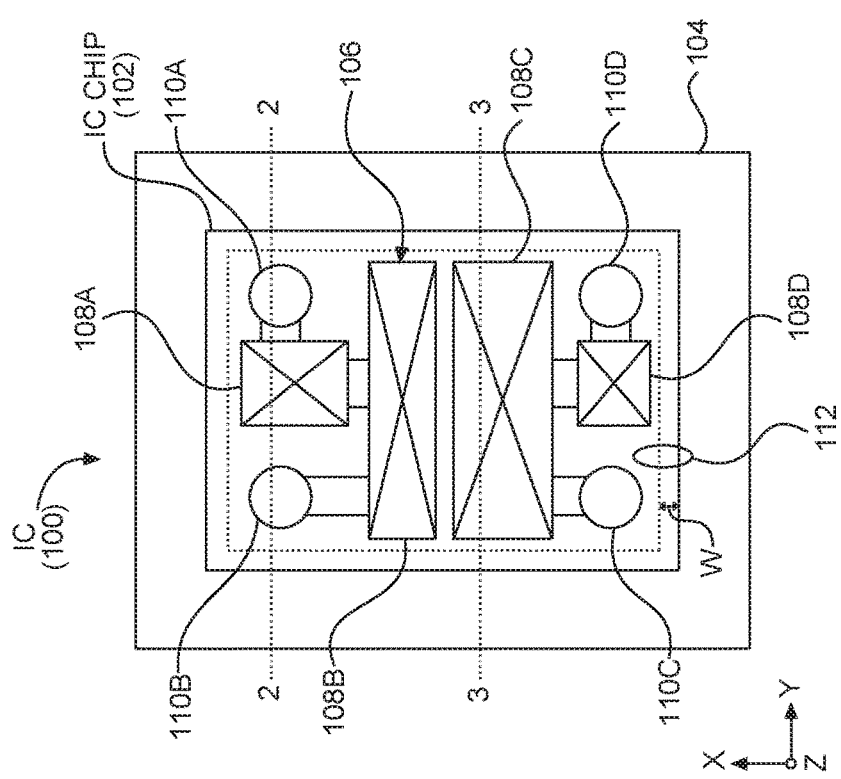

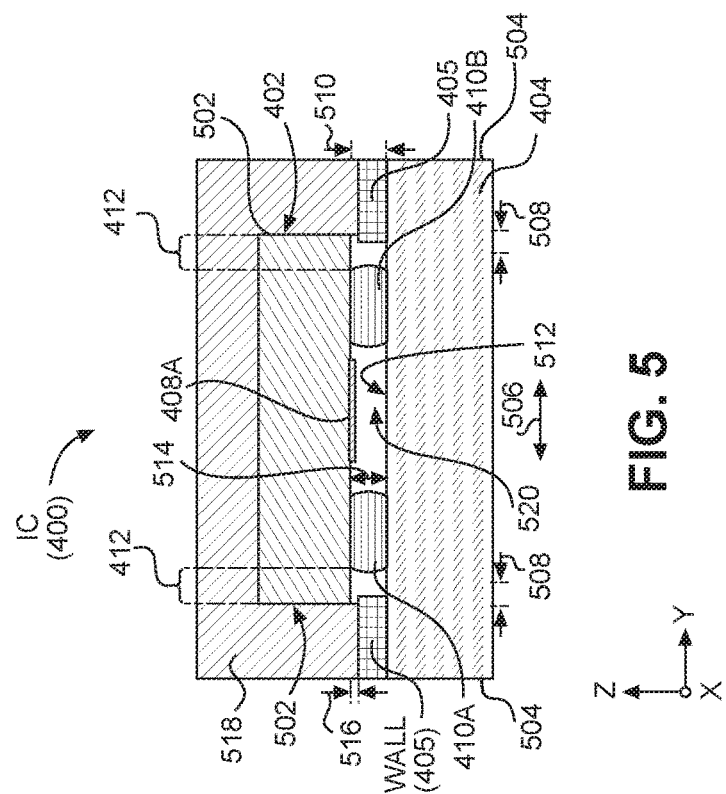
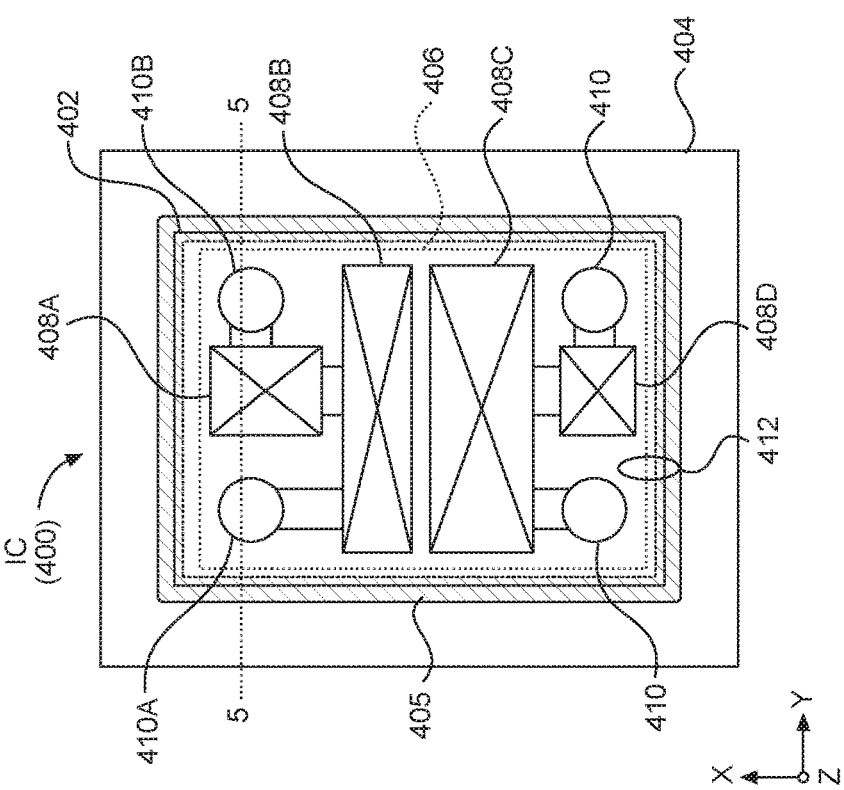
FIG. 5
FIG. 4

SYSTEMS AND METHODS FOR PACKAGING AN ACOUSTIC DEVICE IN AN INTEGRATED CIRCUIT (IC)

PRIORITY CLAIM

The present application claims priority to U.S. Provisional Patent Application Ser. No. 63/005,760 filed on Apr. 6, 2020 and entitled "SYSTEMS AND METHODS FOR PACKAGING AN ACOUSTIC DEVICE IN AN INTEGRATED CIRCUIT (IC)," the contents of which is incorporated herein by reference in its entirety.

BACKGROUND

I. Field of the Disclosure

The technology of the disclosure relates generally to encapsulating integrated circuits (ICs) and, more particularly, to encapsulating ICs having acoustic devices therein.

II. Background

Most mobile communication devices include a radio frequency front end formed from a number of integrated circuits (ICs). These ICs may have different functions such as amplifiers, filters, duplexers, diplexers, and the like. Duplexers and diplexers in particular are useful for operating at different frequency bands or separating transmitted signals from received signals. One of the most effective devices to separate signals at current frequencies of interest is an acoustic wave device, such as a surface acoustic wave (SAW) device. Acoustic devices are generally fragile and accordingly there is always a need for improved packaging options for acoustic devices.

SUMMARY OF THE DISCLOSURE

Aspects disclosed in the detailed description include systems and methods for packaging an acoustic device in an integrated circuit (IC). In an exemplary aspect, an IC is provided that includes an IC chip that includes an acoustic device. The IC is coupled to a wiring substrate to provide connectivity to the IC chip and its acoustic device. For example, the acoustic device may be used as a filter. The IC chip is encapsulated. In exemplary aspects, the IC chip includes walls formed on a wiring substrate. The walls have a height, which is shorter than an expected height of a solder bump on an acoustic device after solder reflow. The walls are positioned on either side of the acoustic device and a small portion lies underneath an exterior edge of the acoustic device such that a relatively small gap is formed between an upper surface of the walls and the lower surface of the acoustic device. By providing a small gap between the walls and the acoustic device, encroachment by an encapsulating material into a keep out zone of the acoustic device is minimized. Reduction of encroachment allows more area within the acoustic device to be used for acoustic elements, which reduces an overall size of the acoustic device.

In this regard in one aspect, an IC is disclosed. The IC includes an IC chip. The IC also includes a wall positioned on a substrate at least partially underneath the IC chip. The IC also includes a gap formed between the wall and the IC chip.

In another aspect, a method of forming an IC is disclosed. The method includes forming a wall on a wiring substrate. The method also includes bonding an IC chip containing an acoustic wave device to the wiring substrate such that a gap remains between a lower surface of the IC chip and an upper surface of the wall.

In another aspect, an IC is disclosed. The IC includes a metallization structure having a first surface and an exterior edge. The IC also includes a chip including an acoustic device, the chip having a second surface. The IC also includes at least one solder bump extending from the first surface of the metallization structure to the second surface of the chip, the at least one solder bump having a first height. The IC also includes at least one wall extending upwardly from the first surface of the metallization structure, the at least one wall having a second height, shorter than the first height and positioned closer to the exterior edge than the solder bump, the at least one wall at least partially between the second surface and the first surface and maintaining a gap between the at least one wall and the second surface. The IC also includes an encapsulating material surrounding the chip and coupled to at least part of the first surface of the metallization structure.

BRIEF DESCRIPTION OF THE FIGURES

FIG. 1 is a top down view of a stylized diagram of a conventional integrated circuit (IC) having an acoustic device positioned over a metallization structure such as a wiring substrate;

FIG. 2 is a cross-sectional side view of the IC of FIG. 1 taken along lines 2-2 of FIG. 1;

FIG. 3 is another cross-sectional side view of the IC of FIG. 1 taken along lines 3-3 of FIG. 1;

FIG. 4 is a top down view of a stylized diagram of an IC having an acoustic device positioned over a wiring substrate using walls according to an exemplary aspect of the present disclosure;

FIG. 5 is a cross-sectional side view of the IC of FIG. 4 taken along lines 5-5 of FIG. 4;

DETAILED DESCRIPTION

Figure 6:
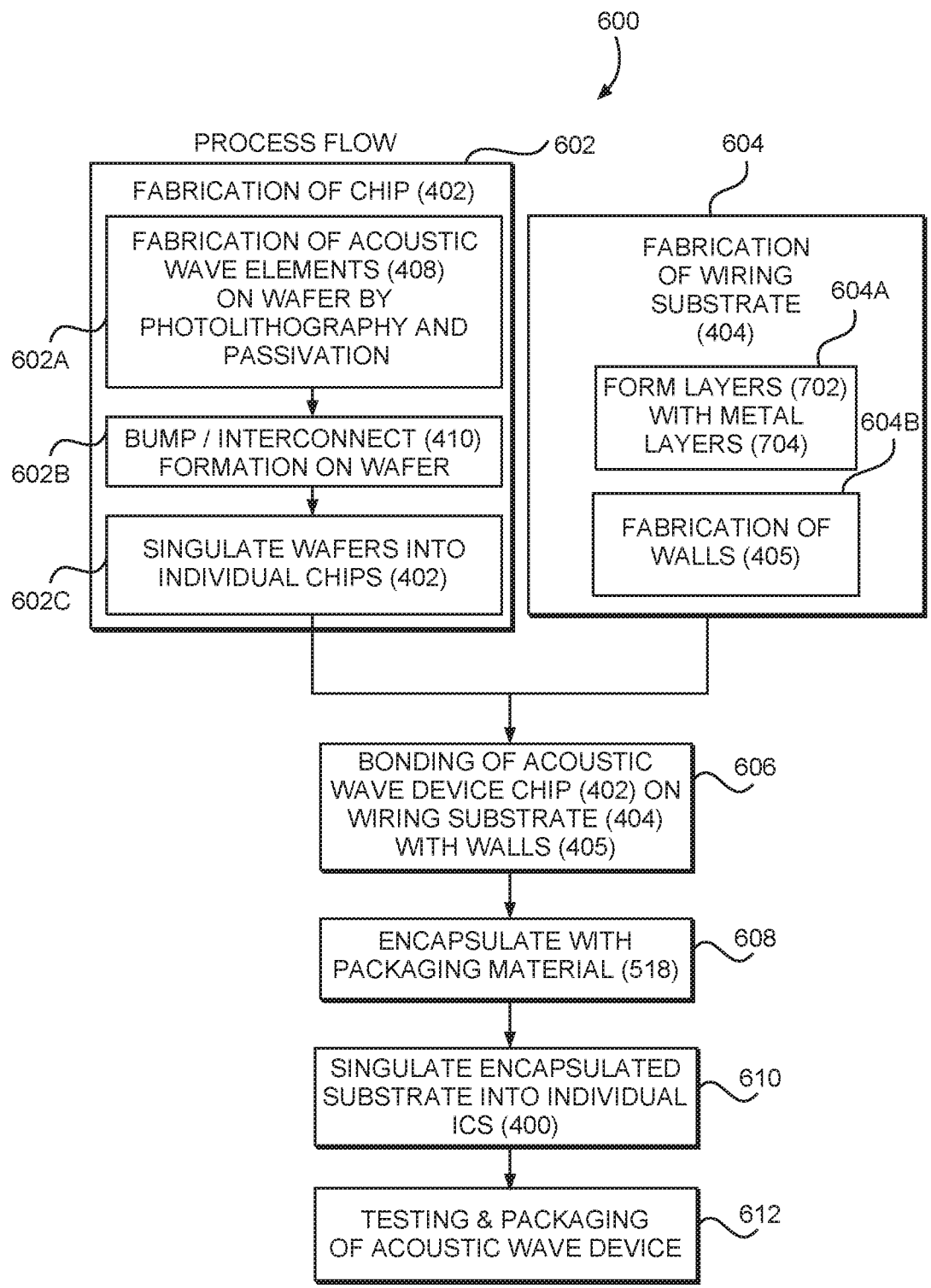
FIG. 6 is a flowchart illustrating an exemplary process for forming the IC of FIG. 4.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems and methods for packaging an acoustic device in an integrated circuit (IC). In an exemplary aspect, an IC is provided that includes an IC chip that includes an acoustic device. The IC is coupled to a wiring substrate to provide connectivity to the IC chip and its acoustic device. For example, the acoustic device may be used as a filter. The IC chip is encapsulated. In exemplary aspects, the IC chip includes walls formed on a wiring substrate. The walls have a height, which is shorter than an expected height of a solder bump on an acoustic device after solder reflow. The walls are positioned on either side of the acoustic device and a small portion lies underneath an exterior edge of the acoustic device such that a relatively small gap is formed between an upper surface of the walls and the lower surface of the acoustic device. By providing a small gap between the walls and the acoustic device, encroachment by an encapsulating material into a keep out zone of the acoustic device is minimized. Reduction of encroachment allows more area within the acoustic device to be used for acoustic elements, which reduces an overall size of the acoustic device.

Before addressing exemplary aspects of the present disclosure, an overview of a conventional IC having an acoustic device is provided with reference to FIGS. 1-3 so that such conventional devices may be contrasted with the advantages of the present disclosure. A discussion of exemplary aspects of an acoustic device in an IC begins below with reference to FIG. 4.

In this regard, FIG. 1 is a top down view of a conventional IC 100 having an IC chip 102 positioned over a wiring substrate 104, which is a metallization structure. The wiring substrate 104 may include wires in the form of metal traces that extend in a plurality of planes defined by the shown X and Y axes. The IC chip 102 contains an acoustic device 106 having acoustic wave elements 108A-108D as is well understood. The acoustic device 106 may be a surface acoustic wave (SAW) device, a temperature compensated surface acoustic wave (TC-SAW) device, a film bulk acoustic resonator (FBAR), a bulk acoustic wave (BAW) device, and a thin film surface acoustic wave (TF-SAW) device. In this context, the type of device may be a filter, duplexer, multiplexer, extractor, or other radio frequency front end (RFFE) product which includes at least one acoustic element.

The IC chip 102 may be a flip-chip device connected to the wiring substrate 104 by interconnects 110A-110D. The IC chip 102 may further have a keep out zone 112 (the space between the solid line and the dotted line of the IC chip 102), that is within the IC chip 102, but has no acoustic wave elements 108. Keep out zones are, as the name implies, areas within an IC chip on or near a processor or device (in this case, the acoustic device) that the circuit board layout design cannot use due to thermal management components, cooling, mounting constraints, and/or operational constraints. For acoustic devices, the keep out zone is the area for which non-use is required to avoid changing the performance characteristics of the acoustic elements (which might, for example, change a center frequency for an acoustic filter).

The IC chip 102 may be manufactured in the form of a wafer, which is then singulated to become a chip and may include a piezoelectric substrate such as lithium tantalite ($LiTaO_3$) or lithium niobate ($LiNbO_3$) as examples. Alternatively, the IC chip 102 may be made of silicon or a silicon-based substrate with a piezoelectric material such as aluminum nitride (AlN) deposited on top. Still another alternative would be a composite wafer such as $LiTaO_3$—Si bonded or $LiTaO_3$-sapphire bonded.

The wiring substrate 104 may be provided to connect the acoustic device 106 to a printed circuit board (PCB, not shown) of a computing device and may include multiple metal layers, inductors, and/or capacitors (none shown). The wiring substrate 104 may be made of a ceramic material such as a high temperature co-fired ceramic (HTCC) or low temperature co-fired ceramic (LTCC), an organic material such as FR4, Roger or Liquid Crystal Polymer (LCP), or a molded substrate such as a molded leadframe. As better seen in FIGS. 2 and 3, the wiring substrate 104 may have a thickness 104T of approximately 80 to 500 microns (μm).

As a note of nomenclature, "approximately" as used herein is defined to mean being within three percent (3%) of the underlying range or number. Thus, approximately 80 to 500 μm covers 77.6-515 μm.

The acoustic wave elements 108A-108D are the functional components of the acoustic device 106 and may, for example, be an interdigital transducer in a SAW device or a piezoelectric material sandwiched between a top electrode and a bottom electrode in a BAW device. The acoustic wave elements 108A-108D may sometimes be referred to as active elements and are generally arranged on the side of the IC chip 102 which is parallel to and facing the wiring substrate 104. That is, the side of the IC chip 102 closest on a Z axis to the wiring substrate 104.

The interconnects 110A-110D may be a solder material such as leadfree solder bumps, made from solder paste printing, solder ball mounting, or electroplating. Alternatively, the interconnects 110A-110D may be made of gold (Au) stud bumps or copper (Cu) pillar bumps.

The keep out zone 112 in a conventional IC 100 may be approximately 35 to 60 μm. If something impinges on this keep out zone 112, the performance of the acoustic device 106 may be negatively impacted. The ramifications of this are discussed in greater detail below.

FIG. 2 is a cross-sectional side view of the IC 100 of FIG. 1 taken along lines 2-2 of FIG. 1. As described above, the IC chip 102 is spaced from the wiring substrate 104 by a height 114 (as defined in the Z axis) of the interconnect (interconnects 110A and 110B shown). To provide protection for the acoustic wave elements 108A-108D against environmental factors such as particles, humidity, and impact force, an encapsulating material 116 is provided to surround (encapsulate) the IC chip 102 and rigidly connect the IC chip 102 to the wiring substrate 104. In particular, a cavity 118 is formed between the IC chip 102 and the wiring substrate 104 and sealed off from any external environmental factors by the encapsulating material 116.

The encapsulating material 116 may be made of epoxy-based material, which may contain fillers such as silica. When the encapsulating material 116 is applied to cover the IC chip 102, some portion of the encapsulating material 116 may creep under the IC chip 102 as better seen in FIG. 3.

FIG. 3 is a cross-sectional side view of the IC 100 of FIG. 1 taken along lines 3-3 of FIG. 1. As noted above, when the encapsulating material 116 is applied to cover the IC chip 102, some portion of the encapsulating material 116 may creep under (in the Z axis) the IC chip 102 by distances 120A and 120B (along the Y axis). That is, during the process by which the encapsulating material 116 is applied to the IC chip 102, the encapsulating material 116 slowly flows ("creeps") into the space under the IC chip 102. The resulting material which lies under the IC chip 102 can be referred to as encroachment thereunder or "creep." Distances 120A, 120B may exceed the width (W) of the keep out zone 112 and touch an acoustic wave element 108 such as element 108C for some portion 122A or 122B, respectively. Such physical contact by the encapsulating material 116 on the acoustic wave element 108C changes the physical properties of waves traveling on the acoustic wave element 108C and thus changes (and likely degrades) performance of the acoustic device 106.

Conventionally, the creep or encroachment of the encapsulating material 116 under the IC chip 102 has been addressed by expanding the keep out zone 112, which increases the overall size of the IC chip 102 and thus likewise increases the size of the IC 100. In general, such size increases are commercially impractical as there is industry pressure to decrease the size of any given IC and particularly to decrease RFFE ICs in which the IC chip 102 may be found. Alternatively, the height 114 of the gap between the IC chip 102 and the wiring substrate 104 may be decreased by using gold bumps for the interconnects 110A-110D. The smaller gap means that less encapsulating material 116 can flow into the gap before hardening, which means less encroachment or creep. While gold bumps may provide the same electrical connection properties while being shorter than solder bumps or copper posts, gold is expensive and harder to fabricate. Accordingly, gold is not an optimal solution to the encroachment problem. Still another solution is the use of a shrink wrap polymer film that seals off the cavity 118 from the encapsulating material. However, the polymer film may stretch when the encapsulating material 116 is applied resulting in some encroachment. Further, it is difficult to control the amount of stretching, resulting in non-uniform creep. Such non-uniform creep requires a worst case assumption when planning a keep out zone 112, which again results in increased size for the IC chip 102.

As discussed in more detail below starting at FIG. 4, exemplary aspects of the present disclosure reduce or eliminate encroachment of encapsulating material under the IC chip by introducing a wall on top of the wiring substrate of the IC. The wall is shorter than the height of the interconnects so that the wall does not touch a lower surface of the chip even though the wall extends from an area just inside an outer edge of the chip to a position out from underneath the chip. The remaining gap between the lower surface of the chip and a top surface of the wall is sufficient to prevent the wall from affecting the physical properties of the wave elements but also close enough to prevent significant creep or encroachment of encapsulating material under the chip.

In this regard, FIG. 4 is a top down view of a stylized diagram of an IC 400 having an IC chip, referred to herein as a chip 402 positioned over (in the Z axis) a metallization structure such as a wiring substrate 404 using walls 405 shown as cross-hatched in FIG. 4, and explained in greater detail below in reference to FIG. 5. In particular, the IC 400 is similar to the IC 100 of FIGS. 1-3 in that the chip 402 contains an acoustic device 406 having acoustic wave elements 408A-408D. While four acoustic wave elements 408A-408D are shown, it should be appreciated that more or fewer acoustic wave elements may be present, and the precise number is not central to the present disclosure. The chip 402 may be a flip-chip device connected to the wiring substrate 404 by interconnects 410A-410D. While four interconnects 410A-410D are shown, it should be appreciated that more or fewer interconnects may be present, and the precise number is not central to the present disclosure. The chip 402 may further have a keep out zone 412 (the space between the solid line and the dotted line of the chip 402) (in the plane formed by the X and Y axes), that is within the chip 402, but have no acoustic wave elements 408.

It should be appreciated that the acoustic wave elements 408A-408D are similar to the acoustic device 106 in structure and purpose and may be a SAW device, a TC-SAW device, a FBAR, a BAW device, and a TF-SAW device. It should further be appreciated that such acoustic devices are formed from a mechanical element operating or vibrating in a cavity. In this context, the type of device may be a filter, duplexer, multiplexer, extractor, or other RFFE product which includes at least one acoustic element.

The chip 402 may be manufactured in the form of a wafer, which is then singulated to become a chip and may include a piezoelectric substrate such as LiTaO3 or LiNbO3. Alternatively, the chip may be made of silicon or a silicon-based substrate with a piezoelectric material such as AlN deposited on top. Still another alternative would be a composite wafer such as LiTaO3—Si bonded or LiTaO3-sapphire bonded.

The wiring substrate 404 may be provided to connect the acoustic device 406 to a printed circuit board (PCB, not shown) of a computing device and may include multiple metal layers, inductors, and/or capacitors (none shown). The wiring substrate 404 may be made of a ceramic material such as an HTCC or LTCC, an organic material such as FR4, Roger or Liquid Crystal Polymer (LCP), or a molded substrate such as a molded leadframe. As better seen in FIG. 5, the wiring substrate 404 may have a thickness of approximately 80 to 500 μm.

The acoustic device 406 may be a SAW device, a TC-SAW device, a FBAR, a BAW device, and a TF-SAW device. In this context, the type of device may be a filter, duplexer, multiplexer, extractor, or other RFFE product which includes at least one acoustic element.

The acoustic wave elements 408A-408D are the functional components of the acoustic device 406 and may, for example, be an interdigital transducer in a SAW device or a piezoelectric material sandwiched between a top electrode and a bottom electrode in a BAW device. The acoustic wave elements 408A-408D may sometimes be referred to as active elements and are generally arranged on the side of the chip 402 which is facing the wiring substrate 404.

FIG. 5 is a cross-sectional side view of the IC 400 of FIG. 4 taken along lines 5-5 of FIG. 5 and better illustrates the wall 405 according to the present disclosure. By design, the wall 405 has a uniform cross-section and circumnavigates the chip 402 from a point just inside an outer edge 502 of the chip 402 laterally outwards to an exterior edge 504 of the wiring substrate 404, where the lateral direction is denoted by arrow 506. The amount of lateral overlap between the wall 405 and the chip 402 is denoted by arrows 508. It should be appreciated that this overlap is less than ten percent of the keep out zone 412. The wall 405 may have a height 510 (in the Z axis) extending up from an upper surface 512 of the wiring substrate 404. Likewise, the interconnects 410 may have a height 514 (in the Z axis) extending up from the upper surface 512 of the wiring substrate 404. By keeping the height 510 of the wall 405 shorter than the height 514 of the interconnects 410, a gap 516 is maintained between the wall 405 and the chip 402. In an exemplary aspect, the height 510 is between approximately twenty (20) and thirty (30) μm, and the height 514 is between approximately thirty (30) and fifty (50) μm. In an exemplary aspect, the gap 516 has a height between one (1) and twenty-one (21) μm, which is sufficiently small to reduce and or eliminate creep from an encapsulating material 518 underneath the chip 402. Once the encapsulating material 518 is present, a cavity 520 beneath the chip 402 is sealed. In a particularly contemplated aspect, the gap 516 has a height of eleven (11) μm. By reducing the creep or encroachment of the encapsulating material 518, the acoustic wave elements 408 may be placed nearer to the outer edge 502 of the chip 402. The use of an expensive gold stud bump is likewise avoided.

In an exemplary aspect, the wall 405 may be made from a polymeric or epoxy-based material such as a solder resist or a permanent photoresist. Alternatively the wall 405 may be made from a ceramic material such as an HTCC or LTCC to match a corresponding material of the wiring substrate 404 (e.g., if the wiring substrate 404 is an HTCC material, then the wall 405 may likewise be made from HTCC material).

FIG. 6 is a flowchart illustrating an exemplary process 600 for forming the IC 400 of FIG. 4, with reference to FIGS. 7A-7E to show the work in progress at the intermediate manufacturing steps of the process 600. In this regard, the process 600 begins in a bifurcated fashion with the relatively concurrent fabrication of the chip 402 (block 602) and fabrication of the wiring substrate 404 (block 604). The fabrication of the chip 402 can be broken down into the fabrication of acoustic wave elements 408 on a wafer by photolithography and passivation (block 602A) as is conventional. Next, bumps or interconnects 410 are formed on the wafer (block 602B) as is conventional. The wafers are then singulated into individual chips 402 (block 602C) such as by cutting.

Figure 7A:
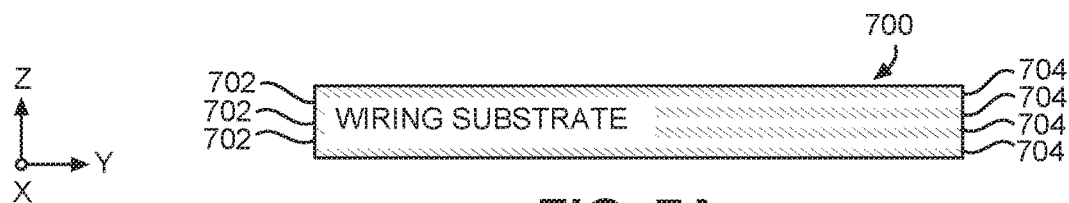
FIGS. 7A-7E illustrate an IC being formed according to the process of FIG. 6 at different stages of the process of FIG. 6.
Figure 7B:
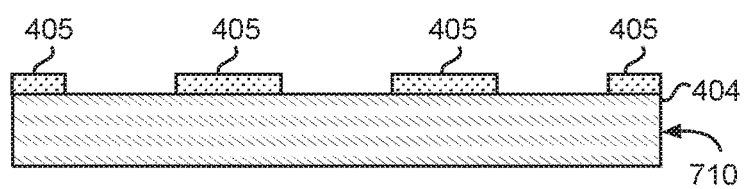
Figure 7C:
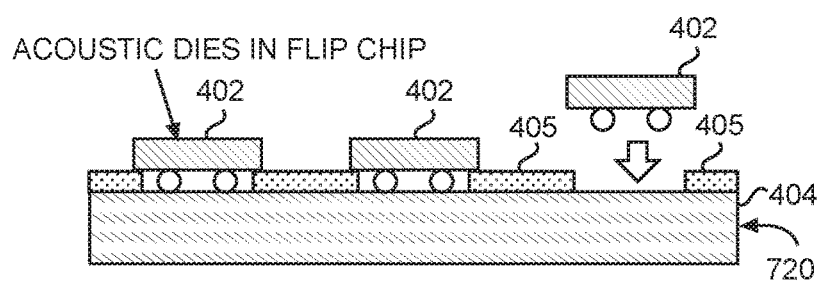
Figure 7D:
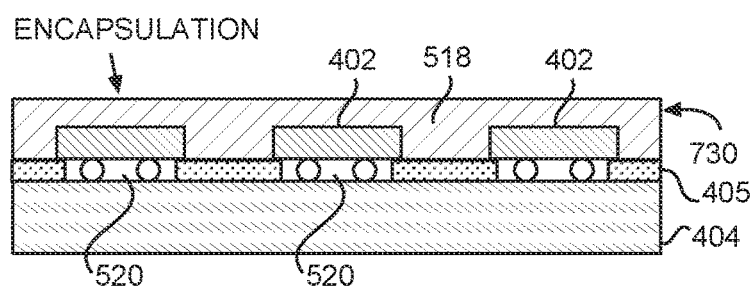
Figure 7E:
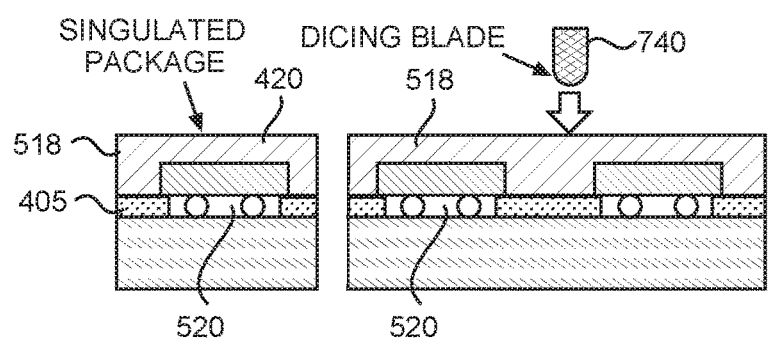

With continued reference to FIG. 6, essentially concurrently, the fabrication of the wiring substrate 402 begins by a wiring substrate 700 having layers 702 with metal layers 704 sandwiched therebetween (block 604A, see also FIG. 7A). As noted, this may be a laminate of ceramic or other materials. Then the walls 405 are fabricated (block 604B, see also FIG. 7B) to form intermediate structure 710 which may be done by a lamination of dry film solder resist followed by patterning steps. The walls 405 may be of a uniform cross-section and circumnavigate the chip 402. The height 510 is carefully controlled to a desired height in view of a height 514 of the solder bumps.

As used herein, essentially concurrently means that both block 602 and block 604 are completed (perhaps asynchronously) before block 606 can begin. There is no strict requirement that the chip 402 and the wiring substrate 404 are made at the same location, at the same time, on the same day, or the like. The only requirement is that both steps be completed before block 606 can begin.

With continued reference to FIG. 6, the chip 402 is then bonded to the wiring substrate 404 having a wall 405 (i.e., intermediate structure 710) (block 606, see also FIG. 7C) to form intermediate structure 720. The chips 402 may be placed through pick and place machinery as flip chips. The bonding may be done by flip chip bonding and reflow soldering.

The intermediate structure 720 is then encapsulated with encapsulating material 518 (sometimes referred to as packaging material) (block 608, see also FIG. 7D) to form intermediate structure 730. This encapsulation forms the cavities 520. Gaps 516 remain between the walls 405 and the chips 402.

The ICs 400 are then formed by singulating encapsulated substrates into individual ICs 400 (block 610, see also FIG. 7E) such as cutting with a dicing blade 740. There may be subsequent testing and packaging of the ICs 400 (block 612). While many of the steps are known, the use of walls 405 provides a difference in the encroachment of the encapsulating material 518 and prevents or reduces performance degradation of the acoustic device.

While the IC 400 is adequate in most regards, there are alternate exemplary aspects of the present disclosure as set forth with reference to FIGS. 8-12.

Figure 8:
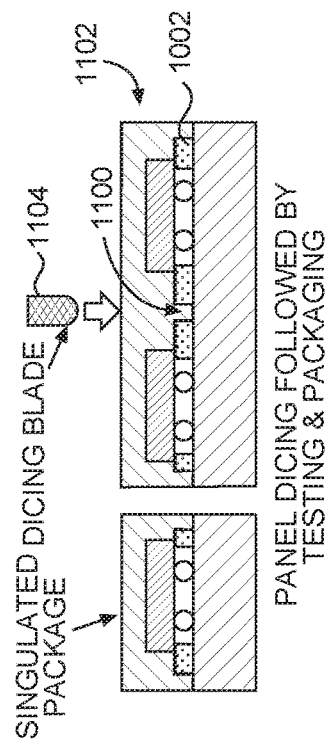
FIG. 8 is a cross-sectional side view of an alternate exemplary aspect of an IC similar to the IC of FIG. 4, but with an intermediate supporting wall.

FIG. 8 is a cross-sectional side view of an alternate exemplary aspect of an IC 800 similar to the IC 400 of FIG. 4, but with an intermediate supporting wall 802 formed in a cavity 520. In most other aspects, the IC 800 is identical to the IC 400 and numbering of comparable elements is the same. The intermediate supporting wall 802 may be provided directly beneath an acoustic wave element 408, but maintaining the gap 516. The intermediate supporting wall 802 may act as a minor heat sink for heat generated by the acoustic wave element 408. Further, the intermediate supporting wall 802 may be of assistance during manufacture to the extent that the wall 802 may prevent over-flexing of the chip 402 during pick and place activities. Note that the use of the intermediate wall structure 802 is optional.

Figure 9:
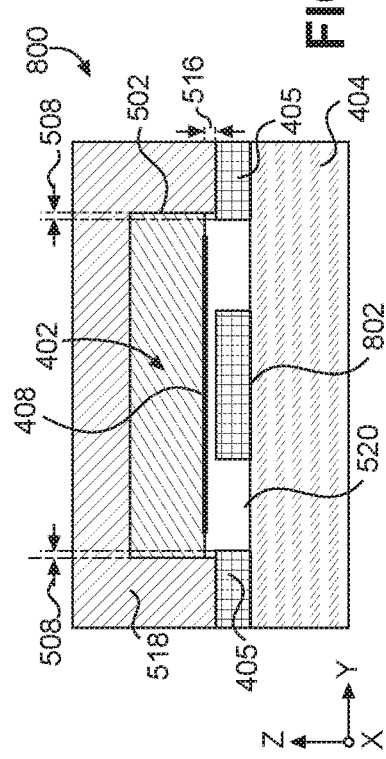
FIG. 9 is a cross-sectional side view of an alternate exemplary aspect of an IC similar to the IC of FIG. 4, but with a two-layer encapsulating material.

FIG. 9 is a cross-sectional side view of an alternate exemplary aspect of an IC 900 similar to the IC of FIG. 4, but with a two-layer encapsulating material. Specifically, a top layer 902 may be provided over a bottom layer 904 (relative to a Z axis). Both layers 902 and 904 may be epoxy-based materials and may be filled with fillers such as silica. The top layer 902 may have a relatively lower storage modulus at low temperature compared to the bottom layer 904 so that during the encapsulation process (e.g., block 608), the distribution of the top layer 902 may be more uniform across the whole wiring substrate 404 to result in better uniformity of height of the IC 900. The bottom layer 904 may have a property of good elongation to reduce creep into the cavity 520. In other regards, the IC 900 is identical to the IC 400.

Figure 10:
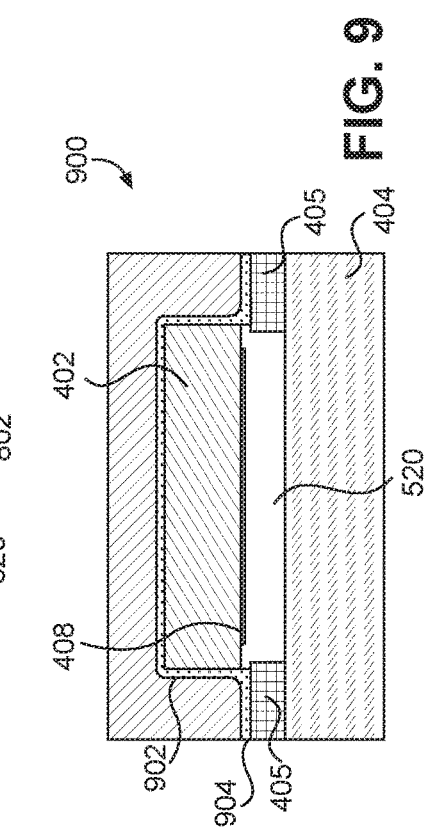
FIG. 10 is a cross-sectional side view of an alternate exemplary aspect of an IC similar to the IC of FIG. 4, but with a smaller lateral dimension to the wall to facilitate dicing of ICs during fabrication.
Figure 11:
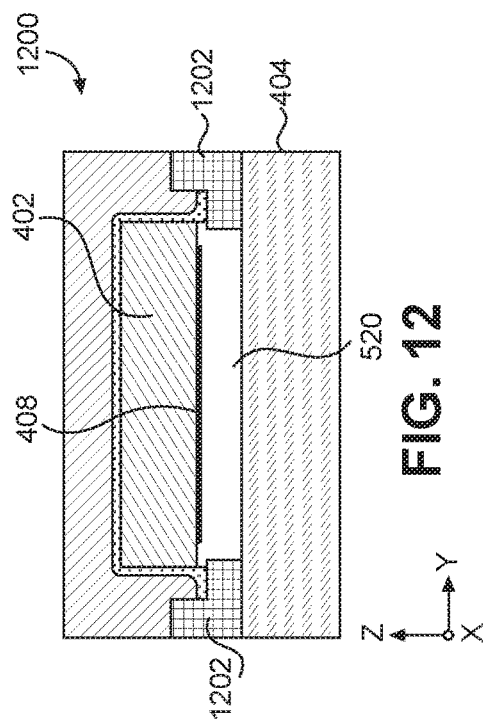
FIG. 11 is a cross-sectional side view analogous to FIG. 7E, but with the IC of FIG. 10 to show how dicing is facilitated.

FIG. 10 is a cross-sectional side view of an alternate exemplary aspect of an IC 1000 similar to the IC 400 of FIG. 4, but with a smaller lateral (as shown in the Y axis) dimension to the wall 1002 to facilitate dicing of ICs 1000 during fabrication as also shown in FIG. 11. In particular, the wall 1002 is spaced interiorly from an outer edge 1004 of the wiring substrate 404 to form a break 1100 (see FIG. 11) in the intermediate structure 1102 so that the dicing blade 1104 cuts through at the break 1100 to reduce a need to cut through the relatively hard material of the wall 1002 and in turn reduce wear rate of the ding blade 1104. While the encapsulating material 1006 is shown as two-layered like the IC 900 of FIG. 9, it should be appreciated that the smaller wall 1002 may be used with single-layer encapsulating material as well.

Figure 12:
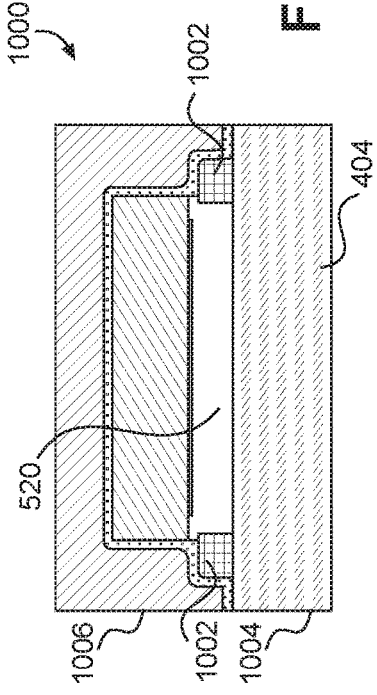
FIG. 12 is a cross-sectional side view of an alternate exemplary aspect of an IC similar to the IC of FIG. 4, but with L-shaped walls.

FIG. 12 is a cross-sectional side view of an alternate exemplary aspect of an IC 1200 similar to the IC 400 of FIG. 4, but with L-shaped walls 1202. In IC 1200, the relevant part of the wall 1202 is still short and beneath the chip 402 with the gap 516 previously described, but having established the gap 516, some portion of the wall 1202 is taller than the lower surface of the chip 402. At present, no advantage for this structure is known relative to the wall 405, but it is included for completeness.

The systems and methods for packaging an acoustic device in an IC according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
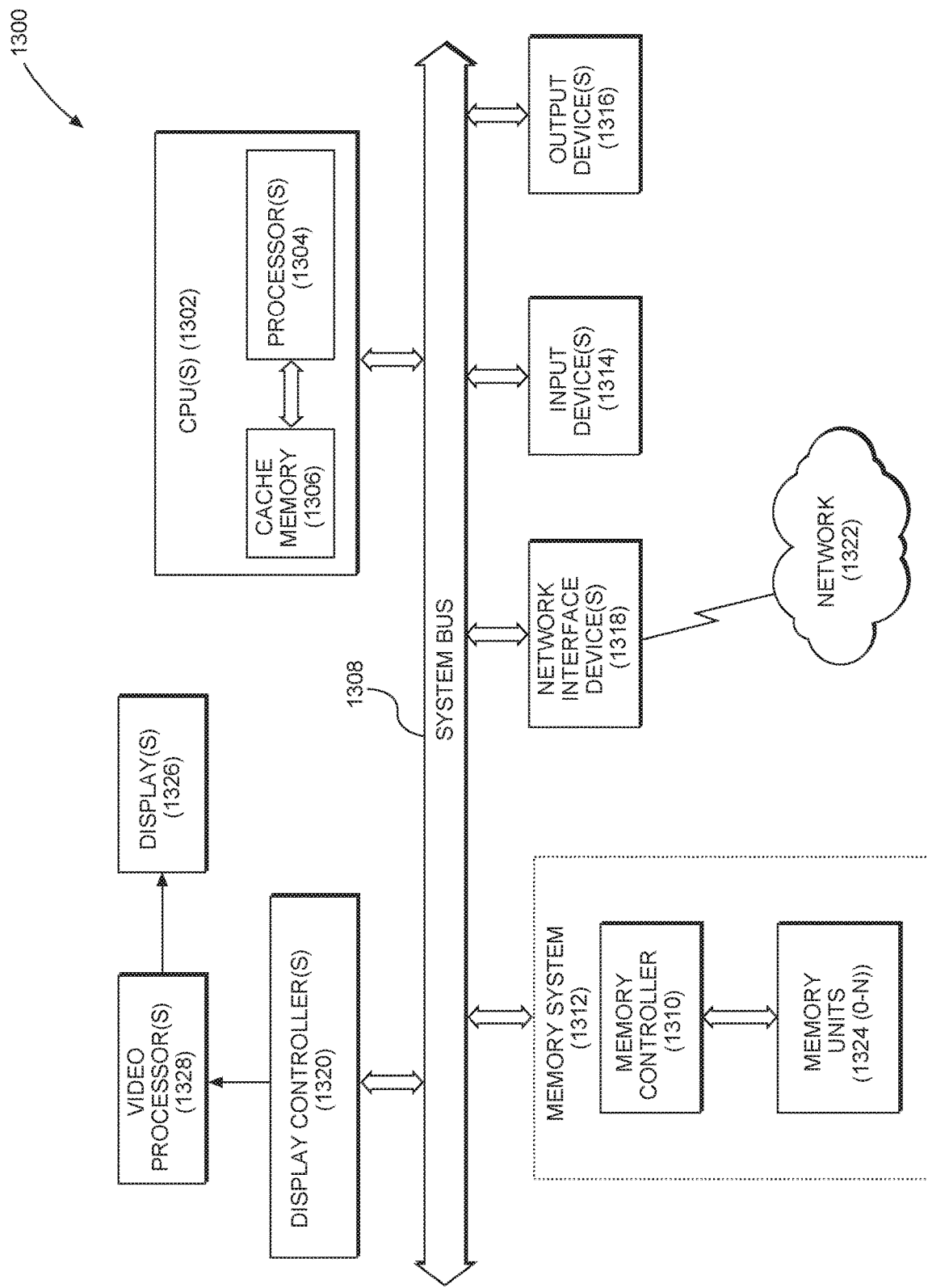
FIG. 13 is a block diagram of an exemplary processor-based system that can include an IC having an acoustic device such as the ICs of FIGS. 4 and 8-12.

In this regard, FIG. 13 illustrates an example of a processor-based system 1300 that can employ the ICs having acoustic devices illustrated in FIGS. 4 and 8-12. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device.

Other master and slave devices can be connected to the system 1308. As illustrated in FIG. 13, these devices can include a memory system 1312, one or more input devices 1314, one or more output devices 1316, one or more network interface devices 1318, and one or more display controllers 1320, as examples. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any devices configured to allow exchange of data to and from a network 1322. In an exemplary aspect, some of the network interface devices 1318 may include the ICs of FIGS. 4 and/or 8-12. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324 (0-N).

The CPU(s) 1302 may also be configured to access the display controller(s) 1320 over the system bus 1308 to control information sent to one or more displays 1326. The display controller(s) 1320 sends information to the display(s) 1326 to be displayed via one or more video processors 1328, which process the information to be displayed into a format suitable for the display(s) 1326. The display(s) 1326 can include any type of display, including, but not limited to, a liquid crystal display (LCD), a plasma display, a light emitting diode (LED) display, etc.

Figure 14:
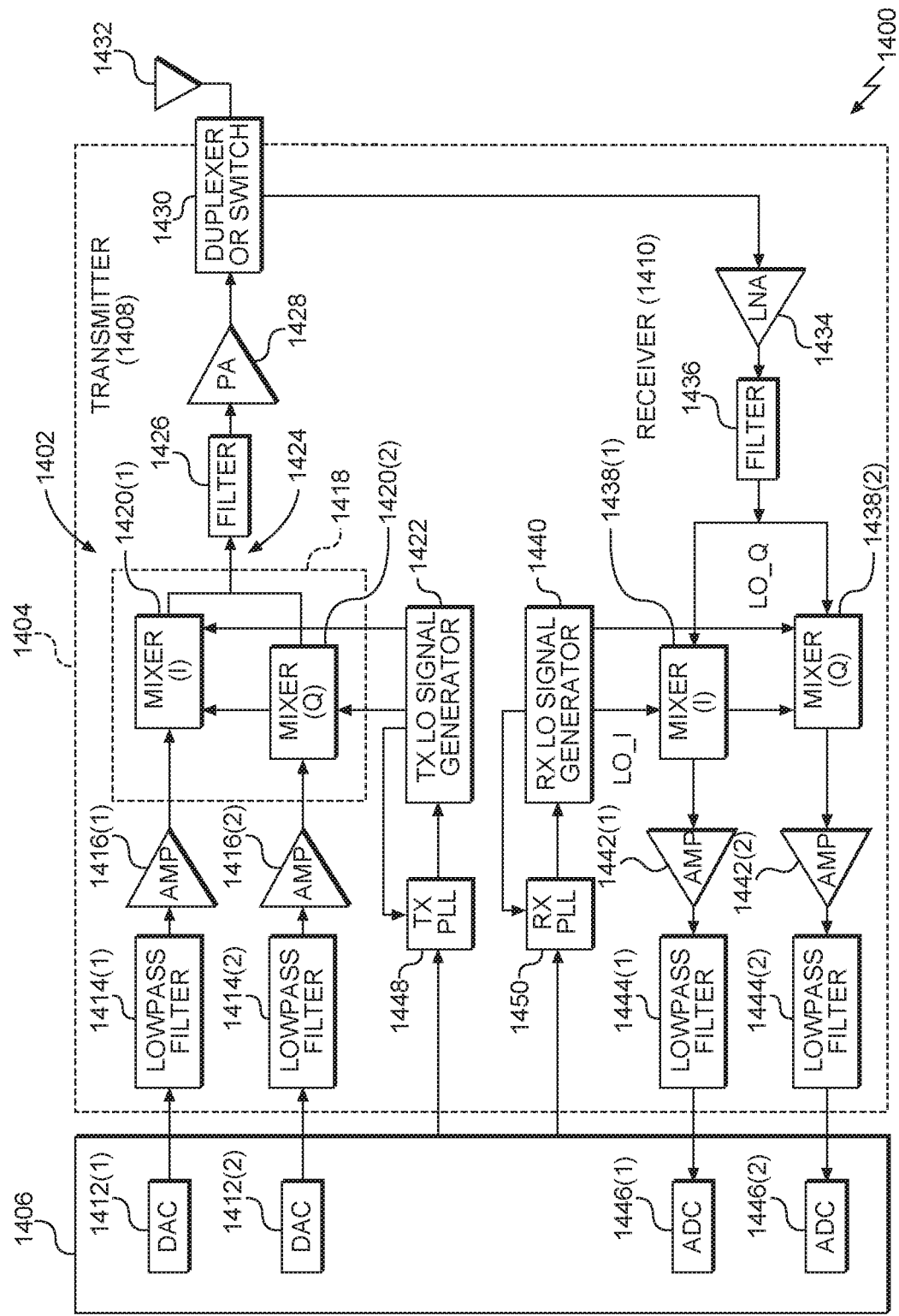
FIG. 14 is a block diagram of a wireless transceiver that can include an IC having an acoustic device such as the ICs of FIGS. 4 and 8-12.

FIG. 14 illustrates an exemplary wireless communications device 1400 that includes radio frequency (RF) components formed from an IC 1402, wherein any of the components therein can include the ICs of FIGS. 4 and/or 8-12, and according to any aspects disclosed herein. The wireless communications device 1400 may include or be provided in any of the above-referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RF ICs (RFICs), mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMPs) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmitted RF signal. The transmitted RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Downconversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by AMPs 1442(1), 1442(2) and further filtered by lowpass filters 1444(1), 1444(2) to obtain I and Q analog input signals, which are provided to the data processor 1406. In this example, the data processor 1406 includes ADCs 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Figure 15:
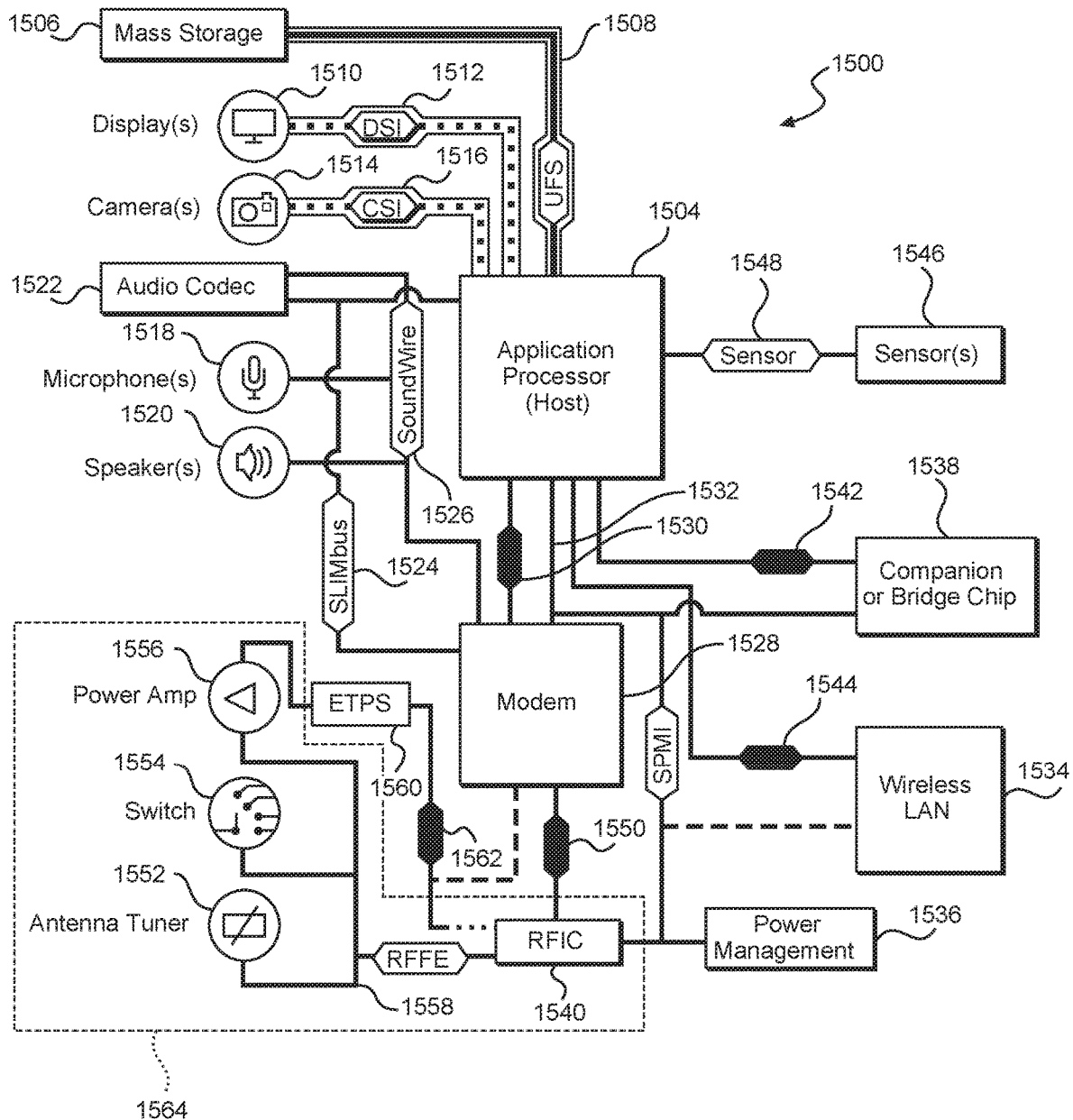
FIG. 15 is a block diagram of an exemplary mobile terminal with a radio frequency front end that may include an IC having an acoustic device such as the ICs of FIGS. 4 and 8-12.

FIG. 15 is a system-level block diagram of an exemplary mobile terminal 1500 such as a smart phone, mobile computing device tablet, or the like and may include a radio frequency front end, which may include one or more acoustic devices in ICs according to the present disclosure. In this regard, the mobile terminal 1500 includes an application processor 1504 (sometimes referred to as a host) that communicates with a mass storage element 1506 through a universal flash storage (UFS) bus 1508. The application processor 1504 may further be connected to a display 1510 through a display serial interface (DSI) bus 1512 and a camera 1514 through a camera serial interface (CSI) bus 1516. Various audio elements such as a microphone 1518, a speaker 1520, and an audio codec 1522 may be coupled to the application processor 1504 through a serial low-power interchip multimedia bus (SLIMbus) 1524. Additionally, the audio elements may communicate with each other through a SOUNDWIRE bus 1526. A modem 1528 may also be coupled to the SLIMbus 1524 and/or the SOUNDWIRE bus 1526. The modem 1528 may further be connected to the application processor 1504 through a peripheral component interconnect (PCI) or PCI express (PCIe) bus 1530 and/or a system power management interface (SPMI) bus 1532.

With continued reference to FIG. 15, the SPMI bus 1532 may also be coupled to a local area network (LAN or WLAN) IC (LAN IC or WLAN IC) 1534, a power management integrated circuit (PMIC) 1536, a companion IC (sometimes referred to as a bridge chip) 1538, and a radio frequency IC (RFIC) 1540. It should be appreciated that separate PCI buses 1542 and 1544 may also couple the application processor 1504 to the companion IC 1538 and the WLAN IC 1534. The application processor 1504 may further be connected to sensors 1546 through a sensor bus 1548. The modem 1528 and the RFIC 1540 may communicate using a bus 1550.

With continued reference to FIG. 15, the RFIC 1540 may couple to one or more RFFE elements, such as an antenna tuner 1552, a switch 1554, and a power amplifier 1556 through a RFFE bus 1558. Additionally, the RFIC 1540 may couple to an envelope tracking power supply (ETPS) 1560 through a bus 1562, and the ETPS 1560 may communicate with the power amplifier 1556. Collectively, the RFFE elements, including the RFIC 1540, may be considered an RFFE system 1564. It should be appreciated that the RFFE bus 1558 may be formed from a clock line and a data line (not illustrated). Elements of the RFFE system 1564 and particularly the antenna tuner 1552 may include ICs having acoustic elements according to exemplary aspects of the present disclosure.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, IC, or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

What is claimed is:

1. An integrated circuit (IC), comprising:
   an IC chip;
   a wall positioned on a substrate at least partially underneath the IC chip;
   a solder bump coupling the IC chip to the substrate the wall having a wall height less than a solder bump height of the solder bump; and
   a gap formed between the wall and the IC chip.

2. The IC of claim 1, wherein the IC chip comprises an acoustic device comprising a cavity.

3. The IC of claim 2, wherein the IC chip comprises a keep out zone and the wall is positioned underneath the IC chip outside the keep out zone.

4. The IC of claim 1, wherein the substrate comprises a metallization structure.

5. The IC of claim 1, wherein the gap is configured to inhibit encroachment within the gap by an encapsulating material surrounding the IC chip.

6. The IC of claim 1, wherein the gap is between one (1) and twenty-one (21) microns (µm).

7. The IC of claim 1, wherein the gap is eleven (11) microns (µm).

8. The IC of claim 1, wherein the IC chip is positioned at a first height above the substrate.

9. The IC of claim 8, wherein the first height is between thirty (30) and forty (40) microns (µm).

10. The IC of claim 9, wherein the wall comprises a second height and wherein the second height is between twenty (20) and thirty (30) microns (µm).

11. The IC of claim 2, wherein the acoustic device comprises a device selected from the group consisting of: a surface acoustic wave (SAW) device, a temperature compensated surface acoustic wave (TC-SAW) device, a film bulk acoustic resonator (FBAR), a bulk acoustic wave (BAW) device, and a thin film surface acoustic wave (TF-SAW) device.

12. The IC of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

13. A method of forming an integrated circuit (IC), the method comprising:
    forming a wall on a wiring substrate, wherein the wall has a wall height; and
    bonding an IC chip containing an acoustic wave device to the wiring substrate using a solder bump having a solder bump height greater than the wall height such that a gap remains between a lower surface of the IC chip and an upper surface of the wall.

14. The method of claim 13, further comprising forming the wiring substrate.

15. The method of claim 14, wherein forming the wall comprises forming a wall having a uniform cross-section circumnavigating the IC chip.

16. The method of claim 13, further comprising forming the IC chip.

17. The method of claim 16, wherein forming the IC chip comprises fabricating at least one acoustic wave element on a wafer.

18. The method of claim 16, wherein forming the IC chip comprises forming a bump on a wafer.

19. The method of claim 16, further comprising singulating the IC chip from other IC chips on a wafer.

20. The method of claim 13, further comprising encapsulating the IC chip with an encapsulating material.

21. The method of claim 20, wherein bonding the IC chip to the wiring substrate comprises maintaining the gap.

22. The method of claim 13, wherein the gap is less than twenty-one (21) microns (µm).

23. The method of claim 13, wherein the gap is eleven (11) microns (µm).

24. An integrated circuit (IC), comprising:
    a metallization structure having a first surface and an exterior edge;
    a chip comprising an acoustic device, the chip having a second surface;
    at least one solder bump extending from the first surface of the metallization structure to the second surface of the chip, the at least one solder bump having a first height;
    at least one wall extending upwardly from the first surface of the metallization structure, the at least one wall having a second height, shorter than the first height and positioned closer to the exterior edge than the solder bump, the at least one wall at least partially between the second surface and the first surface and maintaining a gap between the at least one wall and the second surface; and
    an encapsulating material surrounding the chip and coupled to at least part of the first surface of the metallization structure.

25. The IC of claim 24, wherein the metallization structure comprises a laminate.

26. The IC of claim 24, wherein the metallization structure comprises a ceramic material.

27. The IC of claim 26, wherein the at least one wall comprises a second ceramic material.

28. The IC of claim 24, wherein the at least one wall extends from the exterior edge to underneath the chip.

29. The IC of claim 24, wherein the at least one wall is spaced interiorly of the exterior edge.

30. The IC of claim 24, wherein the encapsulating material comprises a first layer and a second layer of encapsulating material.

31. The IC of claim 24, wherein the gap is between one (1) and twenty-one (21) microns (µm).

32. The IC of claim 24, wherein the gap is eleven (11) microns (µm).

33. The IC of claim 24, wherein the first height is between thirty (30) and forty (40) microns (µm).

34. The IC of claim 33, wherein the second height is between twenty (20) and thirty (30) microns (µm).

35. The IC of claim 24, wherein the acoustic device comprises a device selected from the group consisting of: a surface acoustic wave (SAW) device, a temperature compensated surface acoustic wave (TC-SAW) device, a film bulk acoustic resonator (FBAR), a bulk acoustic wave (BAW) device, and a thin film surface acoustic wave (TF-SAW) device.

36. The IC of claim 24, wherein the encapsulating material fills only a portion of the gap.

\* \* \* \* \*